(12) United States Patent
Jackson et al.

(10) Patent No.: US 7,073,094 B1
(45) Date of Patent: Jul. 4, 2006

(54) METHOD AND SYSTEMS FOR PROGRAMMING AND TESTING AN EMBEDDED SYSTEM

(75) Inventors: Geoffrey Bruce Jackson, Mountain View, CA (US); Chuan-Shin Rick Lin, Milpitas, CA (US)

(73) Assignee: Winbond Electronics Corporation (TW)

( * ) Notice: Subject to any disclaimer, the term of this patent is extended or adjusted under 35 U.S.C. 154(b) by 604 days.

(21) Appl. No.: 10/143,491

(22) Filed: May 9, 2002

(51) Int. Cl.
*G06F 11/00* (2006.01)
(52) U.S. Cl. .................. 714/30; 714/718; 365/201
(58) Field of Classification Search .............. 714/30, 714/36, 735, 742, 718; 365/201; 711/103, 711/104
See application file for complete search history.

(56) References Cited

U.S. PATENT DOCUMENTS

| | | | | |
|---|---|---|---|---|
| 4,481,627 A | * | 11/1984 | Beauchesne et al. | 714/718 |
| 4,955,054 A | * | 9/1990 | Boyd et al. | 379/269 |
| 5,202,978 A | * | 4/1993 | Nozuyama | 714/30 |
| 5,438,528 A | * | 8/1995 | Emerson et al. | 702/119 |
| 5,704,033 A | * | 12/1997 | Park | 714/30 |
| 5,940,627 A | * | 8/1999 | Luciani et al. | 710/14 |
| 6,003,141 A | * | 12/1999 | Ishida | 714/30 |
| 6,035,431 A | * | 3/2000 | Higashida | 714/726 |
| 6,148,362 A | * | 11/2000 | Sagi | 711/102 |
| 6,154,837 A | * | 11/2000 | Fudeyasu et al. | 713/2 |
| 6,349,397 B1 | * | 2/2002 | Koga et al. | 714/727 |
| 6,366,510 B1 | * | 4/2002 | Fibranz | 365/201 |
| 6,493,833 B1 | * | 12/2002 | Utsumi | 714/30 |
| 6,684,290 B1 | * | 1/2004 | Katahira | 711/103 |
| 6,754,533 B1 | * | 6/2004 | Helfinstine et al. | 607/27 |
| 6,839,835 B1 | * | 1/2005 | Kawade et al. | 713/2 |
| 2003/0097522 A1 | * | 5/2003 | Lay et al. | 711/103 |
| 2003/0151507 A1 | * | 8/2003 | Andre et al. | 340/539.13 |

FOREIGN PATENT DOCUMENTS

JP          02012436 A  *  1/1990

* cited by examiner

*Primary Examiner*—Scott Baderman
*Assistant Examiner*—Paul Contino
(74) *Attorney, Agent, or Firm*—Dinh & Associates

(57) ABSTRACT

An embedded system comprising an embedded core, a non-volatile memory (e.g., a Flash memory or a ROM), and a volatile memory (e.g., RAM). The embedded core performs processing tasks for the embedded system. The non-volatile memory stores executable codes for the embedded core. The volatile memory stores program data and auxiliary data for the embedded core during first and second operating modes, respectively. The embedded core executes the executable codes from the non-volatile memory and operates on the program data in the volatile memory in the first operating mode, and retrieves the auxiliary data from the volatile memory and performs processing based on the retrieved auxiliary data in the second operating mode. The embedded system is fully functional in the second operating mode, and the auxiliary data may comprise (1) programming codes used to program the non-volatile memory, or (2) a test program to test the embedded system.

26 Claims, 6 Drawing Sheets

METHOD AND SYSTEMS FOR PROGRAMMING AND TESTING AN EMBEDDED SYSTEM

BACKGROUND

The present invention relates generally to integrated circuits, and more specifically to techniques for programming and testing an embedded system by interchanging access to program space and data space.

As micro-electronic technology advances, it is possible to design and fabricate more and more complicated integrated circuits. An important class of integrated circuits is embedded systems, which cover any integrated circuit (or "chip") having an embedded core and an internal memory. The embedded core is a processing unit (e.g., a processor, a controller, or some other unit) designed to perform processing tasks for the embedded system. The internal memory provides storage for data used by the embedded core.

To provide flexibility, the embedded core is typically designed with some amount of programmability. In a common implementation, the embedded core is a processor designed to execute a set of instructions (which is typically referred to as "firmware" or "codes") stored in the memory. For this design, by providing different sets of instructions in the memory, different applications, features, and functionality may be supported by the embedded system.

For most chips with an embedded core, the programming of the chip is a important consideration (and is also typically a major issue). In some designs, the embedded system is programmed once, typically at the time of manufacturing or testing, for a particular application. These designs may be acceptable for applications that are mature and unlikely to change over time. In some other designs, the embedded system is designed with the ability to reprogram, as necessary. By providing the ability to reprogram the chip, the application firmware of the chip can easily be updated.

In-System Programming (ISP) is a solution that provides the flexibility to reprogram an embedded system. With ISP, the embedded core executes instructions from a fixed read-only-memory (ROM) (which is often referred to as a "boot ROM") to program a digital on-chip non-volatile memory (e.g., a Flash memory or a ROM). The ISP, while providing the desired flexibility to reprogram the embedded system, has several disadvantages. In particular, for ISP, a fixed boot ROM is typically needed to store the instructions for programming the non-volatile memory. The boot ROM is conventionally a separate entity from the on-chip non-volatile memory and its contents are fixed. The boot ROM requires additional silicon area and thus increases the size of the chip die. The larger die size then contributes to a decrease in production yield and hence an increase in production cost for the embedded system with ISP.

For chips with an embedded core, the testing of the chip is also another important consideration. Typically, the testing of such chips is done with the use of test pins, which are pins used only during testing (and not for normal operation) to facilitate testing procedures. The test pins, while providing the necessary access and stimuli to the embedded system, have several disadvantages. In particular, the test pins can occupy a relatively large amount of silicon area. The larger silicon area then contributes to a decrease in production yield and an increase in production cost for the embedded system. Moreover, external stimuli are required to interface with the test pins to test the chip.

As can be seen, techniques that can program and/or test an embedded system, and which ameliorate the disadvantages described above, are highly desirable.

SUMMARY

In accordance with an aspect of the invention, techniques are provided to support programming of embedded systems. With the inventive programming techniques, an embedded core within an embedded system executes instructions (or "programming codes") to program a non-volatile memory (e.g., a Flash memory or a ROM). The instructions used for programming the non-volatile memory are provided by a volatile memory (e.g., a RAM) within the embedded system. During normal operation, the embedded core executes instructions from the ROM and uses the RAM for data space. During programming, the embedded core executes instructions from the RAM to program the ROM. This is achieved by interchanging or "swapping" the ROM and RAM.

In accordance with another aspect of the invention, techniques are provided to facilitate the testing of embedded systems, without the need for additional test pins. In particular, a test program used to test various on-chip units (such as the embedded core) within an embedded system may be loaded into the internal RAM. The test program may then be retrieved and executed by the embedded core. This then reduces the necessary test pins and further facilitates self-test of the embedded core and other on-chip units.

A specific embodiment of the invention provides an embedded system comprising an embedded core, a non-volatile memory (e.g., a Flash memory or a ROM), and a volatile memory (e.g., RAM). The embedded core performs processing tasks for the embedded system. The non-volatile memory stores "executable codes" for the embedded core. The volatile memory stores "program data" for the embedded core during a first operating mode (a normal operating mode) and stores "auxiliary data" for the embedded core during a second operating mode (a swap mode). The embedded core (1) executes the executable codes from the non-volatile memory and operates on the program data in the volatile memory in the first operating mode, and (2) retrieves the auxiliary data from the volatile memory and performs processing based on the retrieved auxiliary data in the second operating mode. The address and data buses for the non-volatile memory and the address and data buses for the volatile memory may be swapped in the second operating mode to allow the embedded core to access codes from different memories in different operating modes.

If the non-volatile memory is to be programmed in the second operating mode, then the auxiliary data comprises programming codes used to facilitate the programming of the non-volatile memory. The embedded core then directs the programming of the non-volatile memory based on the programming codes retrieved from the volatile memory. If the embedded system is to be tested in the second operating mode, then the auxiliary data comprises a test program. The embedded core then tests one or more units within the embedded system based on the test program retrieved from the volatile memory.

Various other aspects, embodiments, and features of the invention are also provided, as described in further detail below.

The foregoing, together with other aspects of this invention, will become more apparent when referring to the following specification, claims, and accompanying drawings.

DESCRIPTION OF THE SPECIFIC EMBODIMENTS

Figure 1:
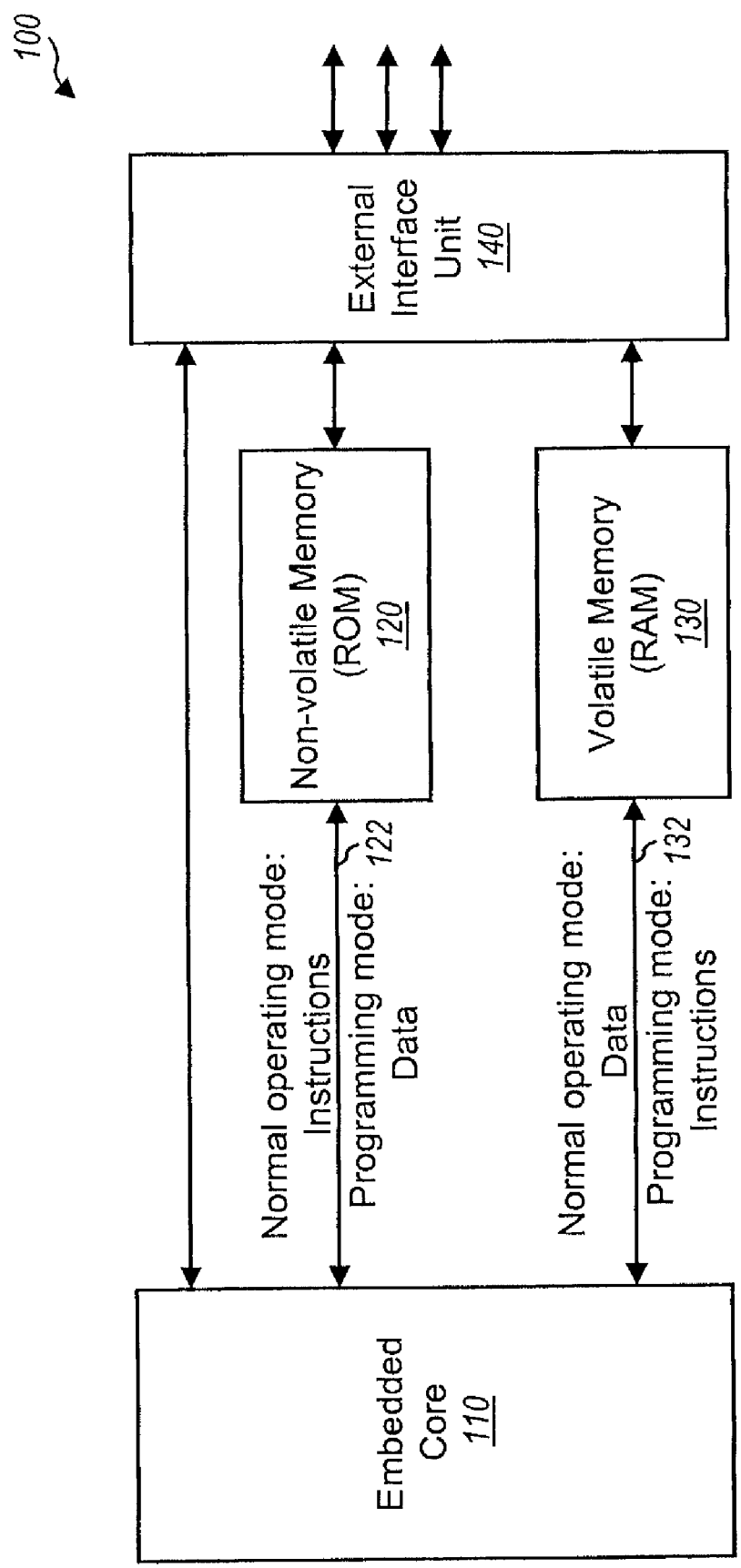
FIG. 1 is a block diagram illustrating an embedded system capable of implementing various aspects and embodiments of the invention.

FIG. 1 is a block diagram illustrating an embedded system 100 capable of implementing various aspects and embodiments of the invention. Embedded system 100 includes an embedded core 110, a non-volatile memory 120, a volatile memory 130, and an external interface unit 140. For simplicity, non-volatile memory 120 is represented as a read-only memory (ROM) and volatile memory 130 is represented (and referred to) as a random-access memory (RAM). Embedded system 100 may be implemented within a single integrated circuit (or chip) or may be implemented within multiple dies that are packaged within a single package.

Embedded core 110 is a processing unit that may be designed to perform any functions and tasks specified for the embedded system. Embedded core 110 may be a processor, a controller, a microprocessor, a digital signal processor, a state machine, or some other processing unit, or a combination thereof. The processing to be performed by embedded core 110 is dependent, in part, on instructions and/or other control inputs, all of which are collectively referred to as "instructions" or "codes". Embedded core 110 may further operate on data and/or other inputs, all of which are collectively referred to as "program data".

ROM 120 may be used to store instructions for embedded core 110 during normal operation. (These instructions are also referred to herein as "executable codes".) ROM 120 may thus be viewed as providing program space for embedded core 110. ROM 120 may be implemented as a Flash memory, a ROM, an electronically erasable programmable ROM (EEPROM), a one time programmable (OTP) ROM, a mask ROM, or some other non-volatile memory technology. ROM 120 couples to embedded core 110 via a first address bus, a first data bus, and a first set of controls, which are collectively shown as lines 122 in FIG. 1.

RAM 130 may be used to store various types of data used by embedded core 110 during normal operation. (This data is also referred to herein as "program data".) RAM 130 may thus be viewed as providing data space for embedded core 110. RAM 130 may be implemented as a dynamic RAM (DRAM), a static RAM (SRAM), or some other volatile memory technology. RAM 130 couples to embedded core 110 via a second address bus, a second data bus, and a second set of controls, which are collectively shown as lines 132 in FIG. 1. Lines 122 for the ROM and lines 132 for the RAM may be implemented as two different sets of lines, or may be a common set of lines that is time-shared by both the ROM and the RAM.

External interface unit 140 couples to embedded core 110, ROM 120, RAM 130, and input/output (I/O) pins of embedded system 100. External interface unit 140 provides the interface to other units, integrated circuits, and/or devices external to embedded system 100. External interface unit 140 may be implemented as a serial interface, a parallel interface, some other interface, or a combination thereof. In an embodiment, to reduce the number of required I/O pins, external interface unit 140 is implemented as a serial interface.

Programming an Embedded System

In accordance with an aspect of the invention, embedded system 100 is designed with the capability to program a non-volatile memory using a volatile memory. This capability allows for reprogramming of the embedded system, for example, to provide new features and functionality, fix old limitations and bugs, and so on.

To program the non-volatile memory, embedded core 110 executes instructions to program ROM 120. (These instructions are also referred to herein as "programming codes".) Conventionally, for In-System Programming (ISP), these instructions are stored in a boot ROM, which requires additional die area to implement. Using the inventive techniques described herein, the programming capability is provided for the embedded system, but without the need for a boot ROM. In particular, the instructions used for programming the non-volatile memory (or ROM) are provided by the volatile memory (or RAM) within the embedded system. A boot ROM thus need not be incorporated into the embedded system, which then provides various advantages.

The existing RAM 130 used to provide storage of program data during normal operation is also used to provide the programming codes when programming the non-volatile memory. In a normal operating mode, embedded core 110 executes instructions from ROM 120 and uses RAM 130 for data space. In a swap mode, the instructions used by the embedded core to program the ROM are provided by the RAM (instead of the boot ROM). This is achieved by effectively interchanging or "swapping" the ROM and RAM, as described in further detail below. This then allows the embedded core to execute instructions from the RAM instead of the ROM in the swap mode.

In an embodiment, in the swap mode, the embedded system is fully functional, just as in the normal operating mode. However, the ROM and RAM are swapped, and codes are retrieved from the RAM instead of the ROM. In general, any code may be stored in the RAM for execution by the embedded core in the swap mode. The only limitation may be on the size of the code that may be stored in the RAM, due to size limitation (if any) of the RAM.

The embedded system may be placed in the swap mode via a swap_mode command, which may be provided to the embedded system by an external source via the external interface unit. Once the ROM and RAM have been swapped in response to receiving the swap_mode command, any instruction that normally accesses (e.g., writes to) the RAM will now be directed to access the ROM. Thus, after the RAM and ROM have been swapped, by issuing commands to read and write the RAM, the ROM can effectively be read and write (programmed) instead. Therefore, flexible techniques are provided for programming the internal ROM within the embedded system.

Figure 2A:
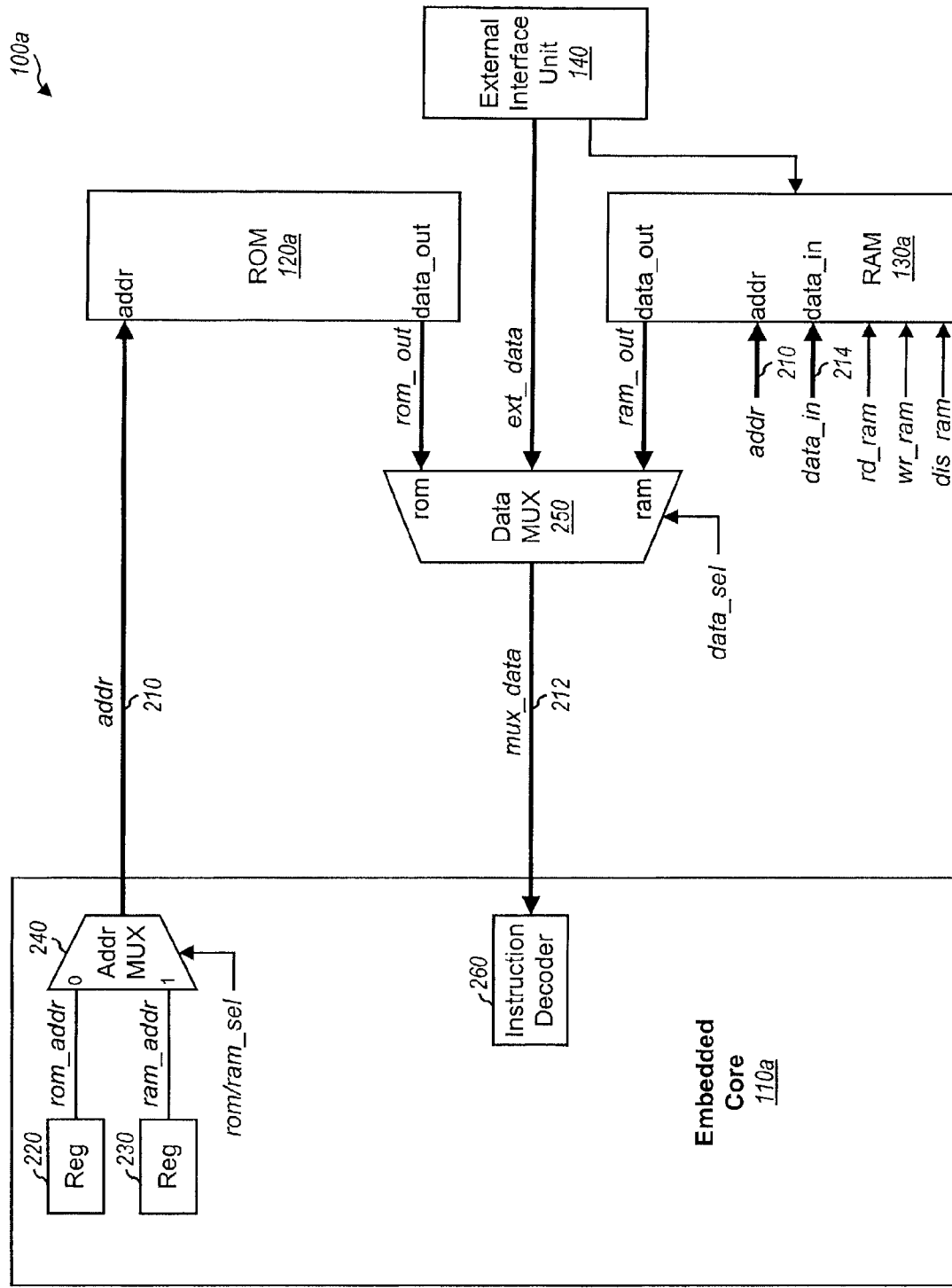
FIG. 2A is a diagram of a specific embodiment of an embedded system illustrating the interconnection between the embedded core and the ROM and RAM, which supports a normal operating mode.

FIG. 2A is a diagram of a specific embodiment of an embedded system 100a illustrating the interconnection between embedded core 10a and ROM 120a and RAM 130a. The embodiment shown in FIG. 2A may be used for the normal operating mode. For this embodiment, to reduce the number of signal lines between the embedded core and the ROM and RAM, one set of address bus and data bus is time shared by both the ROM and RAM. For a given access cycle in the normal operating mode, either the ROM may be accessed to fetch instructions or the RAM may be accessed to fetch program data.

Within the embedded core, a register 220 is used to store an address for the ROM, and a register 230 is used to store an address for the RAM. These registers may be updated by the embedded core as instructions and program data are accessed from the ROM and RAM, respectively. The ROM address (rom_addr) from register 220 and the RAM address (ram_addr) from register 230 are provided to two inputs of an address multiplexer 240, which selects one of the two addresses based on a rom/ram_sel signal. The selected address (addr) is then provided via a common address bus 210 to the address inputs of both the ROM and the RAM. Although registers 220 and 230 and address multiplexer 240 are shown as being implemented within the embedded core, these elements may also be implemented external to the embedded core.

Similarly, a common data bus 212 is used to receive data from both the ROM and RAM. Based on the address provided on address bus 210, ROM 120a provides programming codes or some other data at its output (rom_out), which are then provided to a first (rom) input of a data multiplexer 250. Similarly, based on the address provided on address bus 210, RAM 130a provides program data at its output (ram_out), which is then provided to a second (ram) input of data multiplexer 250. In the embodiment shown in FIG. 2A, the embedded core is also able to receive data from the external interface (ext_data), which is provided to a third input of data multiplexer 250. The data at one of the three inputs of data multiplexer 250 is then selected based on a data_sel signal and provided as the multiplexer output (mux_data), which is then provided via common data bus 212 to the embedded core.

In the embodiment shown in FIG. 2A, RAM 130a also receives input data (data_in) for the RAM, which may be provided by the embedded core or some other on-chip unit via a data bus 214. RAM 130a further receives three control signals—a read enable signal (rd_ram), a write enable signal (wr_ram), and a RAM disable signal (dis_ram). RAM 130a then provides program data stored within the RAM at the received address (addr), if the rd_ram signal is activated. Alternatively or additionally, RAM 130a stores program data provided on data bus 214 into the RAM at the received address, if the wr_ram signal is activated. RAM 130a may also do nothing if the dis_ram signal is activated.

Within the embedded core, an instruction decoder 260 receives the data from data multiplexer 250. If the data is an instruction from the ROM, then instruction decoder 260 decodes the instruction and provides the decoded result to a primary instruction register (not shown in FIG. 2A). This register provides the next command for the embedded core.

As shown in FIG. 2A, while in the normal operating mode, executable codes may be retrieved from the ROM via data multiplexer 250. Program data may also be retrieved from the RAM via data multiplexer 250 or stored to the RAM via data bus 214.

Figure 2B:
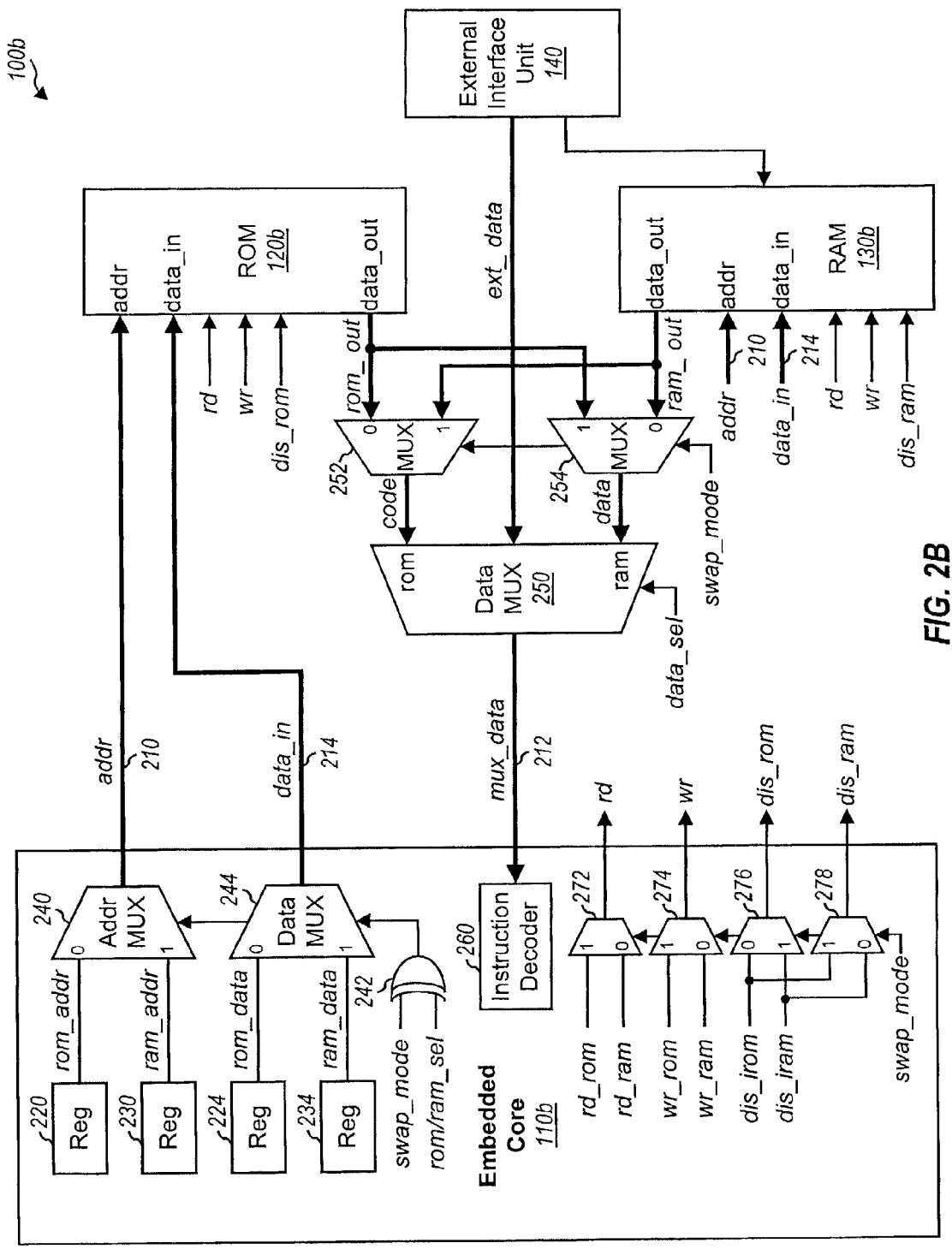
FIG. 2B is a diagram of a specific embodiment of an embedded system illustrating the interconnection between the embedded core and the ROM and RAM, which support both the normal operating mode and the swap mode.

FIG. 2B is a diagram of a specific embodiment of an embedded system 100b illustrating the interconnection between an embedded core 110b and ROM 120b and RAM 130b. The embodiment shown in FIG. 2B includes elements that support both the normal operating mode and the swap mode. In an embodiment, the ROM and RAM are swapped by interchanging or swapping the address and data buses coupling the ROM and RAM to the embedded core. More specifically, in the swap mode, the address bus and data bus for the RAM are effectively coupled to the ROM, and the address bus and data bus for the ROM are effectively coupled to the RAM.

For the specific embodiment shown in FIG. 2B, one set of address bus, input data bus, and output data bus is time shared by both the ROM and RAM. For a given access cycle in the swap mode, either the RAM may be accessed to fetch programming codes for programming the ROM, or the ROM may be accessed to store executable codes to be programmed into the ROM.

Within the embedded core, registers 220 and 230 are used to store addresses for the ROM and RAM, respectively, which are provided to two inputs of address multiplexer 240. An exclusive-OR gate 242 receives the rom/ram_sel signal and a swap_mode signal, performs an exclusive-OR of the two inputs, and provides a control signal for address multiplexer 240. Exclusive-OR gate 242 effectively swaps the addresses of the ROM and RAM, if the swap_mode signal indicates that the ROM and RAM are to be swapped (i.e., swap if swap_mode=logic high). The selected address (addr) is then provided via common address bus 210 to the address inputs of both the ROM and the RAM.

Similarly, registers 224 and 234 are used to store data to be provided for the ROM and RAM, respectively. The ROM input data (rom_data) from register 224 and the RAM input data (ram_data) from register 234 are provided to two inputs of a data multiplexer 244, which selects one of the two data inputs based on the same select signal provided to address multiplexer 240. Data multiplexer 244 then provides the selected data (data_in) via a common data bus 214 to the data inputs of both the ROM and the RAM. During normal operating mode, (program) data from register 234 may be provided via data multiplexer 244 to the RAM. And during the swap mode, (auxiliary) data from register 224 may be provided via data multiplexer 244 to the ROM. The auxiliary data may comprise programming codes used to program the ROM or a test program used to test on-chip units within the embedded system. Although registers 224 and 234 and data multiplexer 244 are shown as being implemented within the embedded core, these elements may also be implemented external to the embedded core.

Common data bus 212 is used to receive data from both the ROM and RAM. The output from the ROM (rom_out) is provided to a ("0") input of a multiplexer 252 and to a ("1") input of a multiplexer 254. Conversely, the output from the RAM (ram_out) is provided to a ("1") input of multiplexer 252 and to a ("0") input of multiplexer 254. Multiplexer 252 selects the executable codes from the ROM output during the normal operating mode and the programming codes from the RAM during the swap mode. Multiplexer 252 then provides the codes (code) selected from either the ROM or the RAM to the first (rom) input of data multiplexer 250. Correspondingly, multiplexer 254 selects the program data from the RAM output during the normal operating mode and the data from the ROM during the swap mode. Multiplexer 254 then provides the data selected from either the ROM or the RAM to the second (ram) input of data multiplexer 250.

The embedded core is also able to receive data from the external interface (ext_data), which is provided to the third input of data multiplexer 250. The data on one of the three inputs of data multiplexer 250 is then selected based on the data_sel signal and provided as the multiplexer output (mux_data), which is then provided via common data bus 212 to the embedded core.

During the normal operating mode, the swap_mode signal is logic low, and the executable codes from the ROM output (rom_out) are provided as the code output from multiplexer 252. And during the swap mode, the swap_mode signal is logic high, and the programming codes from the RAM output (ram_out) are provided as the code output from multiplexer 252. Thus, executable codes may be retrieved from the ROM during the normal operating mode and programming codes may be retrieved from the RAM during the swap mode.

During the normal operating mode, the swap_mode signal is logic low, and the RAM output (rom_out) is provided as the data output from multiplexer 254. And during the swap mode, the swap_mode signal is logic high, and the ROM output (rom_out) is provided as the data output from multiplexer 254. Thus, data may be retrieved from the RAM during the normal operating mode and from the ROM during the swap mode.

Data multiplexer 250 selects one of the three inputs based on the data_sel signal and provides the selected input as the multiplexer output (mux_data), which is then provided via output data bus 212 to the embedded core.

In the specific embodiment shown in FIG. 2B, a multiplexer 272 receives a rd_rom signal and a rd_ram signal at two inputs, selects one of the two inputs based on the swap_mode signal, and provides a read signal (rd) for both the ROM and RAM. A multiplexer 274 receives a wr_rom signal and a wr_ram signal at two inputs, selects one of the two inputs based on the swap_mode signal, and provides a write signal (wr) for both the ROM and RAM. During the normal operating mode, the swap_mode signal is logic low, and the rd_ram signal and wr_ram signal are provided by multiplexers 272 and 274 as the rd and wr signals, respectively. And during the swap mode, the swap_mode signal is logic high, and the rd_rom signal and wr_rom signal are provided by multiplexers 272 and 274 as the rd and wr signals, respectively.

A multiplexer 276 receives a dis_irom signal and a dis_iram signal at two inputs, selects one of the two inputs based on the swap_mode signal, and provides a disable signal (dis_rom) for the ROM. Similarly, a multiplexer 278 receives the dis_irom and dis_iram signals at two inputs, selects one of the two inputs based on the swap_mode signal, and provides a disable signal (dis_ram) for the RAM. During the normal operating mode, dis_irom and dis_iram signals are provided by multiplexers 276 and 278 as the dis_rom and dis_ram signals, respectively. And during the swap mode, the swap_mode signal is logic high, and the dis_irom and dis_iram signals are provided by multiplexers 276 and 278 as the dis_ram and dis_rom signals, which are swapped from the normal operating mode.

FIG. 2B shows a specific design whereby various multiplexers are used to interchange or swap the address/data buses between the ROM and RAM. Other designs may also be used to effectively swap the ROM and RAM, and this is within the scope of the invention.

Figure 3:
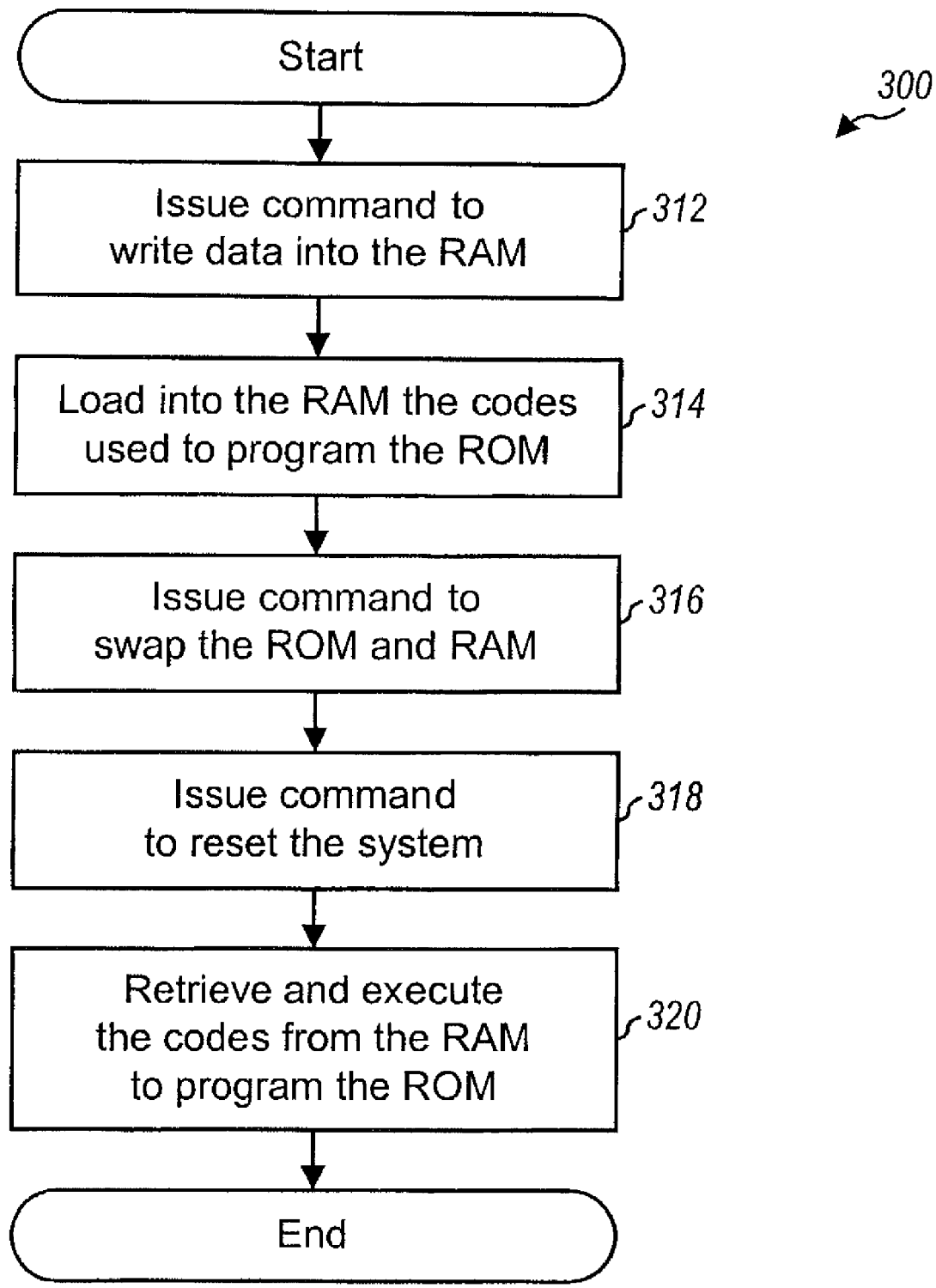
FIG. 3 is a flow diagram of an embodiment of a process for programming the embedded system using programming codes stored in the RAM.

FIG. 3 is a flow diagram of an embodiment of a process 300 for programming the embedded system using programming codes stored in the internal RAM. The programming of the embedded system begins with the loading of the internal RAM, which functions in similar manner as a boot ROM. Initially, a write_ram command is issued to load data into the RAM (step 312). This command may be issued by a source external to the embedded system via the external interface unit. Alternatively, this command may be issued by the embedded core or some other unit within the embedded system.

Programming codes used to program the ROM and possibly other required data are then loaded into the RAM (step 314). As used herein, the programming codes may comprise codes, data, controls, or any combination thereof. The programming codes may be provided via the external interface unit. After the programming codes hava been loaded into the RAM, a swap_mode command is issued to internally switch the address/data buses between the ROM and the RAM, as described above (step 316).

In an embodiment, a reset command is issued (simultaneously or shortly after the address/data buses have been swapped) to reset the system (step 318). The reset command may be issued by the external unit and received by the embedded system via the external interface unit, in similar manner as the write_ram command. The reset command may be used to inform the embedded core and possibly other units within the embedded system that the ROM and RAM have been swapped.

Upon exiting from reset, the embedded core starts to retrieve and execute instructions from the RAM (instead of the ROM) and performs the desired function (step 320). In particular, the embedded core may program the ROM based on the programming codes retrieved from the RAM. Upon completion of the programming of the ROM, the process terminates.

The techniques described herein for programming embedded systems provide various advantages. First, these techniques provide an efficient, easy, and flexible means of programming a non-volatile memory (e.g., a Flash memory or ROM) within an embedded system. Second, the complexity of the embedded system design is reduced by eliminating the need for a boot ROM. The cost of the chip may then be reduced by curtailing the area of the chip.

Testing Embedded Systems

In accordance with another aspect of the invention, techniques are provided herein to facilitate the testing of embedded systems, without the need for additional test pins. In particular, a test program used to test various on-chip units within an embedded system (such as the embedded core) may be loaded into the internal RAM (e.g., via the external interface unit). As used herein, the test program may comprise codes, test vectors, other stimuli or control, or any combination thereof. The test program may then be retrieved and executed by the embedded core. This then reduces the necessary test pins and further facilitates self-test of the embedded core and other on-chip units within the embedded system.

Figure 4:
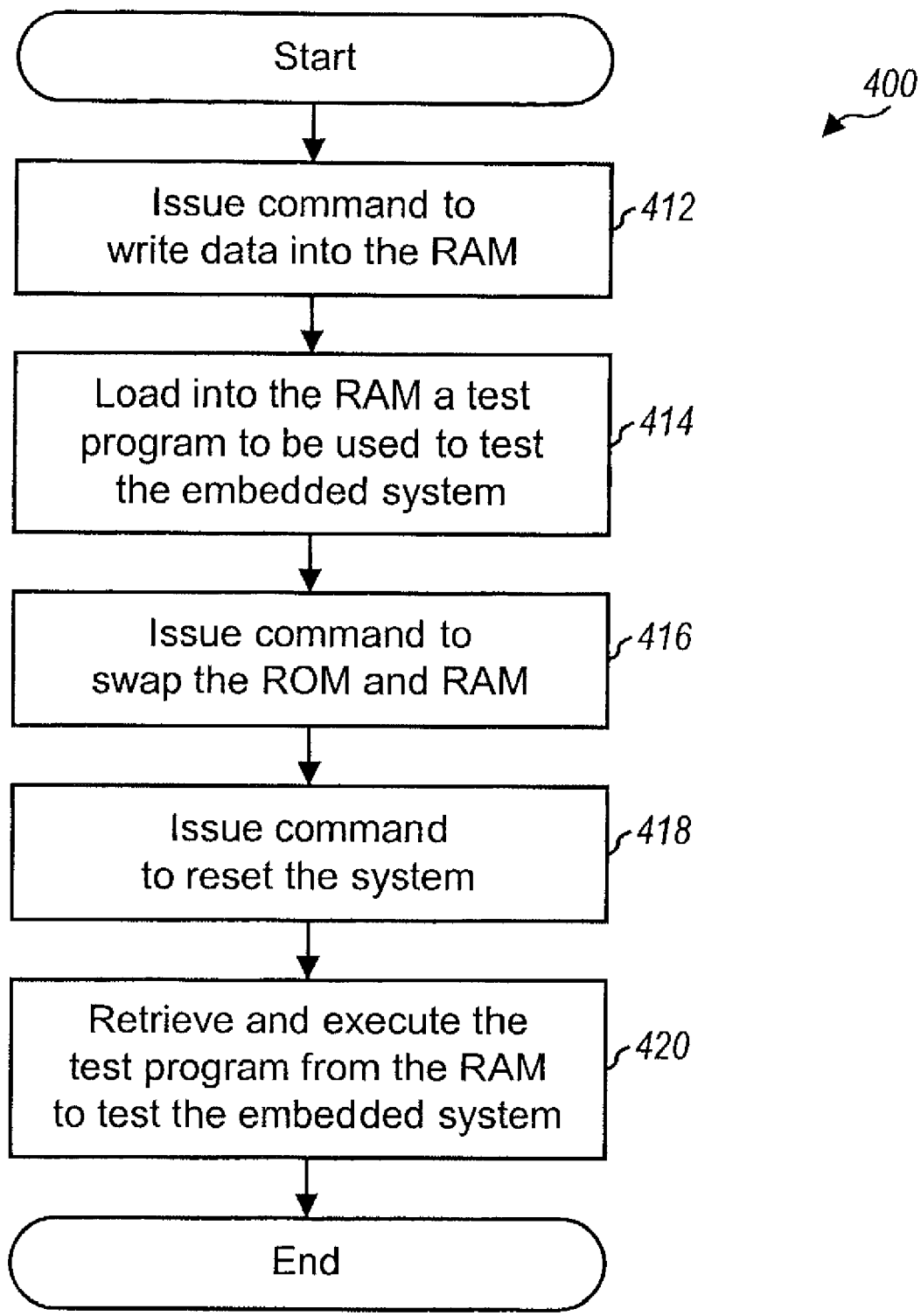
FIG. 4 is a flow diagram of an embodiment of a process for testing the embedded system using test program stored in the RAM.

FIG. 4 is a flow diagram of an embodiment of a process 400 for testing an embedded system using test program stored in the internal RAM. The testing of the embedded system begins with the loading of the RAM with the test program. Initially, a write_ram command is issued to load data into the RAM (step 412). This command may be issued by an external source via the external interface unit, or by the embedded core or some other unit within the embedded system.

The test program used to test the embedded core and the on-chip units is then loaded into the RAM (step 414). The test program may be provided via the external interface unit. After the test program has been loaded into the RAM, a swap_mode command is issued to internally switch the address/data buses between the ROM and the RAM (step 416). The reset command is also issued to reset the system (step 418). Upon exiting from reset, the embedded core retrieves the test program from the RAM and executes the test program to test itself and/or other on-chip units (step 420).

The testing techniques described herein for embedded systems provide several advantages. First, the number of required test pins may be reduced with the use of alternative testing procedures enabled by the use of the internal RAM. Instead of adding test pins to an embedded system to receive external stimuli to test the chip, the inventive testing techniques allow test program to be loaded into the RAM and used to test the chip using the embedded core. Second, these testing techniques may allow for more automated and autonomous testing procedures. Improved product quality may be achieved with improved testing techniques described herein.

Text-to-Speech Conversion Chip

Various aspects and embodiments have been described above for the programming of a non-volatile memory (e.g., a Flash memory) within a generic embedded system, and for the testing of on-chip units in the embedded system. In general, the programming and testing techniques described herein may be used to program and test any embedded system comprised of an embedded core and a memory. The inventive techniques provide the ability to program an on-chip non-volatile memory without the addition of a boot ROM, and further enable an efficient and flexible methodology for testing on-chip units without the addition of external pins.

The programming and testing techniques described herein may be implemented in various types of embedded systems. For clarity, application of the inventive programming and testing techniques to a specific type of embedded system is described below.

Figure 5:
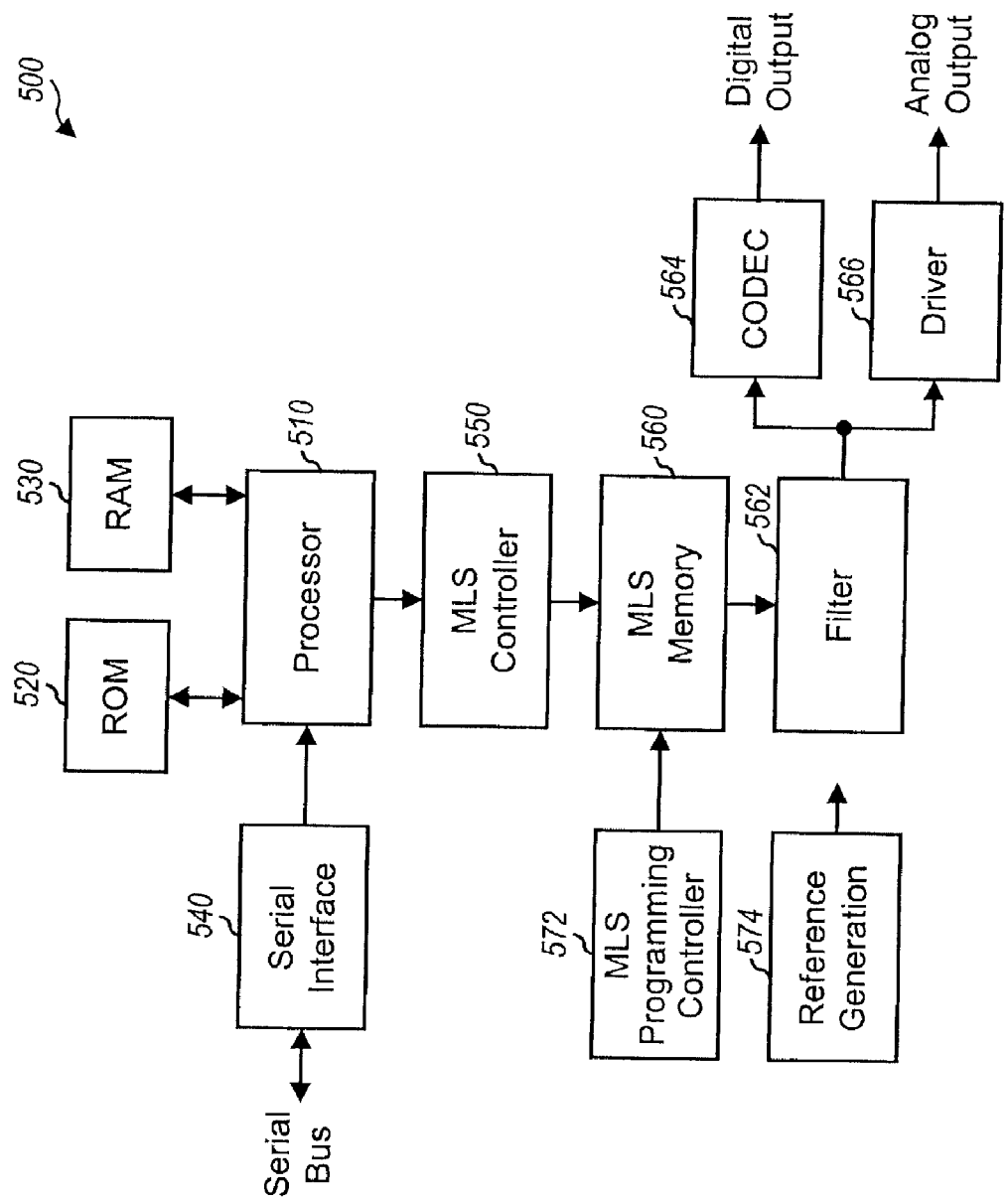
FIG. 5 is a block diagram of a text-to-speech system, which is designed with the inventive programming and testing capabilities.

FIG. 5 is a block diagram of a text-to-speech system 500, which is designed with the inventive programming and testing capabilities. As shown in FIG. 5, text-to-speech system 500 includes a processor 510, on-chip ROM 520 and RAM 530, a serial interface unit 540, and other units.

Within system 500, processor 510 couples to ROM 520, RAM 530, serial interface unit 540, and a multiple level storage (MLS) controller 550. Serial interface unit 540 provides I/O interface for system 500 via a serial port (e.g., a serial peripheral interface (SPI)) and allows processor 510 to communicate with external units and devices.

ROM 520 may be used to store executable codes and possibly other data needed by processor 510 during the normal operating mode. For example, ROM 520 may be used to store executable codes for (1) a text normalization module used to pre-process incoming text and convert it into pronounceable words, which are phonetic representations for the received text, (2) a letter-to-phoneme conversion module used to convert the pronounceable words into phonemes, (3) a phoneme mapping module used to map the phonemes into valid sub-words, words, phonemes, and/or syllables, and (4) a command interpreter and task scheduler used to control the order in which other text-to-speech functional modules are called to process the received data. These various modules are described in further detail in U.S. patent application Ser. No. 10/108,766, entitled "Text-to-Speech Conversion System on an Integrated Circuit," filed Mar. 26, 2002, which is assigned to the assignee of the present application and incorporated herein by reference. During the swap mode, new executable codes and/or other data may be programmed into ROM 520.

RAM 530 may be used to store various types of data used by processor 510 during the normal operating mode. For example, RAM 530 may be used to implement (1) a command buffer used to store pending commands to be processed by the system, (2) an input data buffer used to store the text to be converted to speech, and (3) a word queue, a phoneme queue, an address queue, and a lookup table used to perform the text-to-speech conversion. These various buffers and queues are described in further detail in the aforementioned U.S. patent application Ser. No. 10/108,766. During the swap mode, RAM 530 may be used to store (1) programming codes to be executed by processor 510 to program ROM 520, or (2) test program used by processor 510 to test various on-chip units within the system.

During the normal operating mode, processor 510 executes the executable codes stored in ROM 520 for various modules and operates on various types of data stored in RAM 530. Processor 510 performs the overall control function for system 500 and further performs much of the processing for the text-to-speech conversion. During the swap mode, which may be activated to program a new software version into the ROM or to test the text-to-speech system, processor 510 retrieves and executes the auxiliary data stored in RAM 530 (which may be programming codes or test program) to either program ROM 520, perform testing of on-chip units within the text-to-speech system, or perform some other tasks.

MLS controller 550 interfaces with processor 510 and further controls an MLS memory 560. MLS controller 550 receives commands and addresses/duration from processor 510 and provides the addresses and timing controls to MLS memory 560.

MLS memory 560 provides speech representations for the received addresses. The output from MLS memory 560 is filtered by a filter 562 to remove noise and smooth out discontinuities in the output signal, which are generated as a result of concatenating a series of waveforms for a series of speech representations. A coder/decoder (CODEC) 564 receives and further processes the filtered output to provide the speech output in a digital format, which is more suitable for other digital signal processing units. A driver 566 also receives and conditions the filtered output to provide the speech output in an analog format, which is more suitable for speakers and other components.

An MLS programming controller 572 interfaces with MLS memory 560 and directs the programming of MLS memory 560. MLS programming controller 572 receives instructions to program MLS memory 560, and these instructions may be generated by processor 510. MLS programming controller 572 may also couple directly to serial interface unit 540 and/or processor 510 to receive a new corpus of sound units to be programmed into MLS memory 560. MLS programming controller 572 then prepares MLS memory 560 for programming and further performs various functions needed to program the speech representations for the new corpus of sound units into the MLS memory. A reference generation unit 574 generates various reference voltages and signals needed by various units within system 500, including the references for MLS operations.

Text-to-speech system 500 is described in further detail in the aforementioned U.S. patent application Ser. No. 10/108,766.

The embedded systems, such as the text-to-speech conversion system described in FIG. 5, may be implemented in various integrated circuit technologies such as C-MOS, bipolar, Bi-CMOS, and so on.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An embedded system comprising:
    an embedded core operative to perform processing tasks for the embedded system;
    a non-volatile memory operative to store executable codes for the embedded core during a first operating mode and to store output data from the embedded core during a second operating mode;
    a volatile memory operative to store program data for the embedded core during the first operating mode and to store auxiliary data for the embedded core during the second operating mode; and
    at least one multiplexer operative to swap address and data buses for the non-volatile memory with address and data buses for the volatile memory in the second operating mode, and
    wherein the embedded core is operative to execute the executable codes stored in the non-volatile memory and to operate on the program data stored in the volatile memory in the first operating mode, and wherein the embedded core is further operative to retrieve the auxiliary data from the volatile memory, to perform processing based on the retrieved auxiliary data, and to write the output data to the non-volatile memory in the second operating mode.

2. The embedded system of claim 1, wherein the auxiliary data comprises programming codes used to program the non-volatile memory, and wherein the embedded core is operative to program the non-volatile memory based on the programming codes stored in the volatile memory in the second operating mode.

3. The embedded system of claim 2, wherein the programming codes used to program the non-volatile memory are provided to the volatile memory by a source external to the embedded system.

4. The embedded system of claim 1, wherein the auxiliary data comprises a test program, and wherein the embedded core is operative to test one or more units within the embedded system based on the test program stored in the volatile memory in the second operating mode.

5. The embedded system of claim 1, wherein the non-volatile memory is used for program space and the volatile memory is used for data space in the first operating mode, and wherein the volatile memory is used for program space and the non-volatile memory is used for data space in the second operating mode.

6. The embedded system of claim 1, wherein the non-volatile memory is a Flash memory.

7. The embedded system of claim 1, wherein the volatile memory is a random access memory (RAM).

8. The embedded system of claim 1, wherein the non-volatile memory and volatile memory share a common address bus.

9. The embedded system of claim 1, wherein the non-volatile memory and volatile memory share a common data bus.

10. The embedded system of claim 1, further comprising:
    an external interface unit operative to provide an external interface for the embedded system.

11. The embedded system of claim 1, and configured to implement a text-to-speech conversion system.

12. The embedded system of claim 1, wherein the at least one multiplexer comprises
    a first multiplexer operative to receive a first output from the non-volatile memory and a second output from the volatile memory and to provide the first or second output as code for the embedded core.

13. The embedded system of claim 1, wherein the at least one multiplexer comprises
    a first multiplexer operative to receive a first address for the non-volatile memory and a second address for the volatile memory and to provide the first or second address as an output address.

14. The embedded system of claim 13, wherein the at least one multiplexer further comprises
    a second multiplexer operative to receive data for the non-volatile memory and data for the volatile memory and to provide the data for the non-volatile memory or the data for the volatile memory as output data.

15. The embedded system of claim 1, wherein the embedded core, the non-volatile memory, the volatile memory, and the at least one multiplexer are packaged within an integrated circuit (IC) package.

16. An integrated circuit comprising:
    an embedded core operative to perform processing tasks for the integrated circuit;
    a non-volatile memory operative to store executable codes for the embedded core during a first operating mode and to store output data from the embedded core during a second operating mode;
    a volatile memory operative to store program data for the embedded core during the first operating mode and to store auxiliary data for the embedded core during the second operating mode;
    at least one address bus coupling the non-volatile memory and the volatile memory to the embedded core;
    at least one data bus coupling the non-volatile memory and the volatile memory to the embedded core; and
    at least one multiplexer operative to swap address and data buses for the non-volatile memory with address and data buses for the volatile memory in the second operating mode, and
    wherein the embedded core is operative to execute the executable codes stored in the non-volatile memory and to operate on the program data stored in the volatile memory in the first operating mode, and wherein the embedded core is further operative to retrieve the auxiliary data from the volatile memory, to perform processing based on the retrieved auxiliary data, and to write the output data to the non-volatile memory in the second operating mode.

17. The integrated circuit of claim 16, wherein the auxiliary data comprises programming codes used to program the non-volatile memory, and wherein the embedded core is operative to program the non-volatile memory based on the programming codes stored in the volatile memory in the second operating mode.

18. The integrated circuit of claim 16, wherein the auxiliary data comprises test program, and wherein the embedded core is operative to test one or more units within the embedded system based on the test program stored in the volatile memory in the second operating mode.

19. The integrated circuit of claim 16, and configured to implement a text-to-speech conversion system.

20. A method for programming a non-volatile memory in an embedded system, comprising:
  issuing a first command to write data to a volatile memory, wherein the volatile memory is operative to store program data for the embedded system during a first operating mode and to store programming codes used to program the non-volatile memory during a second operating mode;
  loading the programming codes into the volatile memory;
  issuing a second command to swap address and data buses for the non-volatile memory with address and data buses for the volatile memory;
  retrieving the programming codes from the volatile memory; and
  programming the non-volatile memory based on the programming codes retrieved from the volatile memory.

21. The method of claim 20, further comprising:
  issuing a reset command after the address and data buses for the non-volatile memory and the volatile memory have been swapped.

22. The method of claim 20, wherein the programming codes are loaded into the volatile memory from a source external to the embedded system.

23. A method for testing an embedded system, comprising:
  issuing a first command to write data to a volatile memory, wherein the volatile memory is operative to store program data for the embedded system during a first operating mode and to store a test program to test one or more units within the embedded system during a second operating mode;
  loading the test program into the volatile memory;
  issuing a second command to swap address and data buses for a non-volatile memory with address and data buses for the volatile memory;
  retrieving the test program from the volatile memory;
  testing the one or more units within the embedded system based on the test program retrieved from the volatile memory; and using the non-volatile memory to store output data in the second operating mode.

24. The method of claim 23, wherein the one or more units within the embedded system to be tested include an embedded core.

25. An embedded system comprising:
  an embedded core operative to perform processing tasks for the embedded system;
  a non-volatile memory operative to store executable codes for the embedded core;
  a volatile memory operative to store program data for the embedded core during a first operating mode and to store auxiliary data for the embedded core during a second operating mode; and
  at least one multiplexer operative to swap address and data buses for the non-volatile memory with address and data buses for the volatile memory in the second operating mode, wherein the at least one multiplexer further comprises
    a first multiplexer operative to receive a first output from the non-volatile memory and a second output from the volatile memory and to provide the first or second output as code for the embedded core, and
    a second multiplexer operative to receive the first output from the non-volatile memory and the second output from the volatile memory and to provide the first or second output as data for the embedded core, and
  wherein the embedded core is operative to execute the executable codes stored in the non-volatile memory and to operate on the program data stored in the volatile memory in the first operating mode and wherein the embedded core is further operative to retrieve the auxiliary data from the volatile memory and to perform processing based on the retrieved auxiliary data in the second operating mode.

26. An embedded system comprising:
  a non-volatile memory operative to store codes in a first operating mode and to store data in a second operating mode;
  a volatile memory operative to store codes in the second operating mode and to store data in the first operating mode; and
  at least one multiplexer operative to swap address and data buses for the non-volatile memory with address and data buses for the volatile memory in the second operating mode; and
  an embedded core operative to execute the codes stored in the non-volatile memory and to write data to the volatile memory in the first operating mode, and to execute the codes stored in the volatile memory and to write data to the non-volatile memory in the second operating mode.

* * * * *